United States Patent
Inoue et al.

(10) Patent No.: US 9,622,344 B2
(45) Date of Patent: Apr. 11, 2017

(54) MULTILAYER WIRING BOARD WITH ENCLOSED UR-VARIANT DUAL CONDUCTIVE LAYER

(71) Applicant: KABUSHIKI KAISHA NIHON MICRONICS, Musashino-shi, Tokyo (JP)

(72) Inventors: Tatsuo Inoue, Musashino (JP); Takayasu Sugai, Musashino (JP); Toshiyuki Kudo, Musashino (JP); Toshinori Omori, Musashino (JP)

(73) Assignee: KABUSHIKI KAISHA NIHON MICRONICS, Musashino-Shi, Tokyo (JP)

(*) Notice: Subject to any disclaimer, the term of this patent is extended or adjusted under 35 U.S.C. 154(b) by 231 days.

(21) Appl. No.: 14/391,748

(22) PCT Filed: Feb. 28, 2013

(86) PCT No.: PCT/JP2013/055318
§ 371 (c)(1),
(2) Date: Oct. 10, 2014

(87) PCT Pub. No.: WO2013/153869
PCT Pub. Date: Oct. 17, 2013

(65) Prior Publication Data
US 2015/0107884 A1    Apr. 23, 2015

(30) Foreign Application Priority Data
Apr. 11, 2012    (JP) ................. 2012-090516

(51) Int. Cl.
*H05K 1/02*    (2006.01)
*H05K 3/46*    (2006.01)
*H05K 1/09*    (2006.01)

(52) U.S. Cl.
CPC ......... *H05K 1/0298* (2013.01); *H05K 1/0242* (2013.01); *H05K 3/46* (2013.01);
(Continued)

(58) Field of Classification Search
None
See application file for complete search history.

(56) References Cited

U.S. PATENT DOCUMENTS 4,695,515 A * 9/1987 Shirai ................. B32B 15/08
                                                    257/E23.006
4,767,674 A * 8/1988 Shirai ................. B32B 15/08
                                                    257/E23.006
(Continued)

FOREIGN PATENT DOCUMENTS

JP    2004327745 A    11/2004
JP    2006211183 A    8/2006
(Continued)

*Primary Examiner* — Jeremy C Norris
*Assistant Examiner* — Muhammed Azam
(74) *Attorney, Agent, or Firm* — Browdy and Neimark, PLLC

(57) ABSTRACT

A multi-layer wiring board includes wiring layers stacked on a substrate with an insulating layer between each layer. A wire formed in the wiring layer consists of a first layer and a second layer to form a double layered structure. The first layer is made of a first conductive material and the second layer is made of a second conductive material having relative magnetic permeability of 10 or more and larger than that of the first conductive material. The characteristic impedance of the wire is adjusted to a value closer to 50 ohms than that of a wire which has the same thickness as of the wire with the double layered structure, and is made only of the first conductive material.

21 Claims, 4 Drawing Sheets

(52) U.S. Cl.
CPC ........... *H05K 1/025* (2013.01); *H05K 1/0233* (2013.01); *H05K 1/09* (2013.01); *H05K 2201/0154* (2013.01); *H05K 2201/0338* (2013.01); *H05K 2201/0391* (2013.01); *H05K 2201/0776* (2013.01); *H05K 2201/0792* (2013.01); *H05K 2201/083* (2013.01); *Y10T 29/49155* (2015.01)

(56) References Cited

U.S. PATENT DOCUMENTS

| | | | | |
|---|---|---|---|---|
| 5,171,642 A | * | 12/1992 | DeHaven | H01L 21/4846 204/192.17 |
| 5,638,597 A | * | 6/1997 | Cutting | H01L 21/4857 156/248 |
| 5,900,308 A | * | 5/1999 | Koike | H01P 1/20363 428/209 |
| 5,955,175 A | * | 9/1999 | Culler | F41H 3/00 135/93 |
| 6,326,557 B1 | * | 12/2001 | Cheng | H05K 1/0216 174/255 |
| 6,515,563 B2 | * | 2/2003 | Koga | H01P 3/081 333/246 |
| 6,576,485 B2 | * | 6/2003 | Zhou | G01R 1/06711 257/E23.021 |
| 6,600,224 B1 | * | 7/2003 | Farquhar | H01L 24/83 257/678 |
| 2001/0046125 A1 | * | 11/2001 | Rehm | H01L 23/5383 361/760 |
| 2002/0070831 A1 | * | 6/2002 | Harding | H01F 17/0033 336/180 |
| 2003/0127728 A1 | * | 7/2003 | Audet | H01L 23/50 257/713 |
| 2004/0000961 A1 | * | 1/2004 | Killen | H01P 1/2135 333/33 |
| 2004/0000972 A1 | * | 1/2004 | Killen | H01P 1/20336 333/204 |
| 2004/0000975 A1 | * | 1/2004 | Killen | H01P 7/082 333/219 |
| 2004/0000976 A1 | * | 1/2004 | Killen | H01P 1/2039 333/219 |
| 2005/0099240 A1 | * | 5/2005 | Lin | H01P 3/02 333/5 |
| 2006/0094101 A1 | * | 5/2006 | Yannoni | C07K 14/4702 435/194 |
| 2006/0267705 A1 | * | 11/2006 | Schumacher | H01P 3/06 333/1 |
| 2006/0286696 A1 | * | 12/2006 | Peiffer | H05K 1/16 438/27 |
| 2007/0045801 A1 | * | 3/2007 | Sugiyama | H05K 1/0271 257/684 |
| 2007/0258173 A1 | * | 11/2007 | Chen | G11C 5/04 361/42 |
| 2007/0284138 A1 | * | 12/2007 | Chen | H05K 1/117 174/260 |
| 2008/0035369 A1 | * | 2/2008 | Joodaki | H05K 1/0218 174/255 |
| 2008/0230259 A1 | * | 9/2008 | Booth, Jr. | H05K 1/0224 174/254 |
| 2009/0056983 A1 | * | 3/2009 | Liu | H05K 1/0245 174/255 |
| 2009/0184778 A1 | * | 7/2009 | Park | H05K 1/0216 333/12 |
| 2010/0136366 A1 | * | 6/2010 | Sasaoka | C23C 26/00 428/632 |
| 2010/0164520 A1 | * | 7/2010 | Kiyofuji | G01R 31/2875 324/756.03 |
| 2011/0121846 A1 | | 5/2011 | Mochizuki | |
| 2011/0124299 A1 | * | 5/2011 | Koujima | G06K 19/07749 455/73 |
| 2011/0290380 A1 | * | 12/2011 | Okayama | B32B 15/01 148/536 |
| 2012/0031648 A1 | * | 2/2012 | Ebe | C25D 5/10 174/250 |
| 2012/0127672 A1 | * | 5/2012 | Osen | G06F 1/182 361/728 |
| 2012/0196144 A1 | * | 8/2012 | Tzou | C25D 1/04 428/607 |
| 2014/0028341 A1 | * | 1/2014 | Mikuni | G01R 1/07307 324/756.03 |
| 2014/0133120 A1 | * | 5/2014 | Sawatari | H05K 1/185 361/772 |

FOREIGN PATENT DOCUMENTS

| | | |
|---|---|---|
| JP | 2008205099 A | 9/2008 |
| JP | 2009181804 A | 8/2009 |
| JP | 2010002257 A | 1/2010 |
| JP | 2010002302 A | 1/2010 |
| JP | 2010087037 A | 4/2010 |
| JP | 2001284878 A | 10/2011 |

\* cited by examiner

MULTILAYER WIRING BOARD WITH ENCLOSED UR-VARIANT DUAL CONDUCTIVE LAYER

FIELD OF THE INVENTION

The present invention relates to a multi-layer wiring board and a process for manufacturing the same. In detail, the present invention relates to a multi-layer wiring board which is easy to adjust characteristic impedance and is able to adapt to narrow-pitch tendency of the terminals in large scale semiconductor integrated circuit and the like, and a process for manufacturing the same.

BACKGROUND OF THE INVENTION

For mounting a large scale semiconductor integrated circuit (called "LSI" hereinafter), various types of thin-film multi-layer wiring boards are used as a LSI loaded wiring board. In a probe card for inspecting electrical properties of all of the LSIs on a wafer collectively, multi-layer wiring boards are also used due to the necessity of arranging probes in a pitch corresponding to that of the terminals in the LSIs.

In these multi-layer wiring boards, adjustment of characteristic impedance of transmission lines is carried out in order to avoid disorder of wave form, delay, and deterioration of transmission signals caused by impedance mismatching. For example, Patent Literatures 1 and 2 disclose technique for reducing characteristic impedance mismatching between a via and a wire in a wiring layer by controlling characteristic impedance of a via or a pair of vias which connect wiring layers in a multi-layer wiring board. However, Patent Literatures 1 and 2, while they disclose technique for adjusting characteristic impedance of a via or a pair of vias in a multi-layer wiring board, give no suggestions about adjustment of characteristic impedance of a wire formed in a wiring layer of a multi-layer wiring board.

On the other hand, Patent Literature 3 discloses technique for adjusting characteristic impedance of a wire by placing an earthing conductive part in parallel to a wire in a probe card so as to form microstrip line and by changing the width of the wire and the thickness of the insulating layer. However, there is nothing in Patent Literature 3 that refers to either the adjustment of characteristic impedance of a wire in multi-layer wiring board, or adaptation to the narrow-pitch tendency of the terminals in LSI or the like. Further, according to the inventors' confirmation, as described below, it is difficult to apply the technique disclosed in Patent Literature 3 directly to a multi-layer wiring board used in a probe card or the like which is adapted to the narrow-pitch tendency of terminals.

At present, there is a continued demand for pursuing higher density in connection with LSI, etc. In consequence, a wiring pitch of 50 μm or less is desired. On the other hand, it is required for a wire to have an electric current capacity of about 1 A (ampere). Further, it is needed for a wire to have characteristic impedance $Z_0$ of 50Ω (ohm). In order to satisfy all of these requirements, it is necessary to use a copper (Cu) wire having a width of 25 μm, a thickness of about 10 μm, and a wiring pitch of 25 μm, and such wire requires the insulating layer inserted between the wiring layers to have a thickness of about 20 μm. When an insulating layer having a thickness of 20 μm is formed by using a conventional polyimide as an insulating material, a copper wire having a width of 25 μm and a thickness of 10 μm is formed on the front surface of the insulating layer, and a solid pattern ground layer is formed on the back surface of the insulating layer to compose a microstrip line as shown in FIG. 5, the characteristic impedance $Z_0$ is calculated approximately using the below described Formula (1). In FIG. 5, the reference numeral 101 indicates a wire, 102 indicates an insulating layer, 103 indicates a solid pattern ground layer, the reference symbol H indicates the thickness of the insulating layer, W indicates the width of the wire, and T indicates the thickness of the wire.

$$Z_0 = \frac{87}{\sqrt{\varepsilon_r + 1.41}} \times \ln\left[\frac{5.98 \times H}{0.8 \times W + T}\right] \quad \text{Formula (1)}$$

In Formula (1), $Z_0$, H, W and T represent characteristic impedance, thickness of the insulating layer, width of the wire and thickness of the wire, respectively, as mentioned above. $\varepsilon_r$ represents relative dielectric constant of the insulating layer. When H=20 μm, W=25 μm, T=10 μm and $\varepsilon_r$=3.7 are substituted into Formula (1), the characteristic impedance $Z_0$ of the wire is calculated as $Z_0$=53.1 (Ω), which is almost close to the required characteristic impedance of 50 ohm (Ω).

In a multi-layer wiring layer, however, a wire locates in an inner layer surrounded by insulating layers and a solid pattern ground layer exists in both upper and lower sides of the wire. Thus, a strip line as shown in FIG. 6, for example, is formed (In FIG. 6, the same symbols as in FIG. 5 indicate the same materials or parts as in FIG. 5). The characteristic impedance $Z_0$ of the strip line as shown in FIG. 6 can be calculated approximately using the following Formula (2).

$$Z_0 = \frac{60}{\sqrt{\varepsilon_r}} \times \ln\left[\frac{1.9 \times (2 \times H + T)}{0.8 \times W + T}\right] \quad \text{Formula (2)}$$

In Formula (2), $Z_0$ represents characteristic impedance, H represents thickness of upper and lower insulating layers, W represents width of a wire, T represents thickness of a wire and $\varepsilon_r$ represents relative dielectric constant of the insulating layer. When H=20 μm, W=25 μm, T=10 μm and $\varepsilon_r$=3.7 are substituted into Formula (2), the characteristic impedance $Z_0$ of the wire is calculated as $Z_0$=36.0 (Ω), which is much lower than the required characteristic impedance of 50 ohm (Ω). Consequently, in a multi-layer wiring board adapted to narrow-pitch tendency of the terminals, it is difficult to adjust the characteristic impedance of a wire to around 50 ohm by simply applying the technique disclosed in Patent Literature 3.

PRIOR ART LITERATURES

Patent Literatures

Patent Literature 1: Japanese Patent Kokai No. 2008/205099 (JP2008/205099 A1)
Patent Literature 2: Japanese Patent Kokai No. 2010/2257 (JP2010/2257 A1)
Patent Literature 3: Japanese Patent Kokai No. 2010/2302 (JP2010/2302 A1)

SUMMARY OF THE INVENTION

Disadvantages to be Resolved by the Invention

The present invention was made to resolve the disadvantages of the above mentioned prior art and the object of the present invention is to provide a multi-layer wiring board and a process for manufacturing the same, said multi-layer wiring board is easy to adjust the characteristic impedance and is able to adapt to narrow-pitch tendency of the terminals in LSI and the like. Another object of the present invention is to provide a probe card equipped with said multi-layer wiring layer.

Means of Resolving the Disadvantages

After having made continuous efforts to attain the above mentioned object, the present inventors have found that the characteristic impedance $Z_0$ of a wire is represented by the following Formula (3), and that the characteristic impedance can be increased as shown in the following Formula (4) when a part or the whole of the wiring material is replaced by a magnetic permeable material (i.e. a conductive material having large relative magnetic permeability).

$$Z_0 = \frac{E}{H} = \sqrt{\frac{\mu}{\varepsilon}} \qquad \text{Formula (3)}$$

In Formula (3), $Z_0$ represents characteristic impedance, E represents electric field (vector), H represents magnetic field (vector), $\mu$ represents magnetic permeability, and $\in$ represents dielectric constant.

$$Z_1 = \sqrt{\mu_0} \times Z_0 \qquad \text{Formula (4)}$$

In Formula (4), $Z_0$ represents original characteristic impedance, $Z_1$ represents characteristic impedance after the wiring material having been replaced by a magnetic permeable material, and $\mu_0$ represents magnetic permeability of the magnetic permeable material.

As shown in Formula (4), when a magnetic permeable material is used as a conductive material which forms a wire, the characteristic impedance $Z_0$ of the wire increases in proportion to a square root of $\mu_0$ and the characteristic impedance of the wire rises from $Z_0$ to $Z_1$. As the conventional conductive materials such as copper used for a wire are non-magnetic permeable materials, it is considered that the characteristic impedance of a wire can be increased if a part of the conductive material such as copper used for a wire is replaced by a conductive material having large relative magnetic permeability. Based on the findings as mentioned above and after having repeated various trial and errors, the present inventors have accomplished the present invention.

Thus, the present invention resolves the above mentioned disadvantages by providing a multi-layer wiring board, in which more than one wiring layers are stacked on a substrate with an insulating layer between them, wherein a wire formed in the wiring layer has a double layered structure consist of a first layer and a second layer, and said first layer is made of a first conductive material and said second layer is made of a second conductive material having relative magnetic permeability larger than that of the first conductive material, thereby the characteristic impedance of said wire is adjusted to a value closer to 50 ohm than that of a wire which has the same thickness as of said wire having the double layered structure, and is made of said first conductive material only.

As mentioned above, in the multi-layer wiring board according to the present invention, a part of the first conductive material which forms the wire is replaced by the second conductive material having magnetic permeability larger than that of the first conductive material. In consequence, the characteristic impedance of the wire increases over a characteristic impedance of a wire which has the same thickness and is made of the first conductive material only. Thereby, it is possible to adjust a characteristic impedance of a wire to a value close to 50 ohm.

As the first conductive material, copper (Cu) or silver (Ag) is preferably used. As the second conductive material, it is preferable to use nickel (Ni), cobalt (Co), or an alloy comprising nickel and/or cobalt. Relative magnetic permeability of copper is 0.999991, and that of silver is 0.99998, which are both very small and less than 1.0. Therefore, copper and silver are non-magnetic permeable material. On the other hand, relative magnetic permeability of nickel is 600, and that of cobalt is 250, which are both large and 10 or more. Therefore, nickel and cobalt are magnetic permeable material.

In a preferable embodiment of the present invention, the width of a wire is not less than 10 μm, but not more than 25 μm. When the width of a wire becomes less than 10 μm, it is difficult to make flow electric current of 1 A in capacity in the wire, which is not preferable. When the width of a wire becomes more than 25 μm, it is impossible to adapt to the presently desired wire pitch of 50 μm or less, which is not preferable.

The thickness of the first layer is preferably not less than 6 μm, but not more than 20 μm, and the thickness of the second layer is preferably not less than 5%, but not more than 50% of the thickness of the first layer. When the thickness of the first layer is less than 6 μm, it is difficult to make flow electric current of 1 A in capacity even though the width of the wire is 25 μm, which is not preferable. On the other hand, when the thickness of the first layer is more than 20 μm, the total thickness of the wire including the thickness of the second layer much exceeds 20 μm and the difference in thickness becomes large between the area with the wire and the area without the wire, which causes so called step coverage problem. In that case, the process for applying insulating layer becomes difficult and defects such as holes are created in the insulating layer, which may prevent the insulating layer from maintaining required insulation. That is not preferable. When the thickness of the second layer is less than 5% of the thickness of the first layer, the increment of the characteristic impedance is not so large, and the advantage obtainable by replacing a part of the first conductive material by the second conductive material may not be sufficient, which is not preferable. When the thickness of the second layer is more than 50% of the thickness of the first layer, the ratio of the first conductive material which forms the first layer becomes relatively small and the conductor resistance increases. In consequence, the desired electric current capacity will be unsatisfied, which is not preferable.

In the multi-layer wiring board of the present invention, basically a wire has a double layered structure, in which the first layer may be placed on or under the second layer. However, in the case where copper is selected as the first conductive material forming the first layer, for example, the surface of copper is sometimes oxidized due to the exposure during manufacturing processes. In order to prevent the surface of copper from being oxidized, it is preferable to place the second layer on the first layer, in other words, to place the second layer at a position further from the substrate of a multi-layer wiring board than the first layer. In this case, as the second conductive material which forms the second layer, it is preferable to use a conductive material which has magnetic permeability and is so chemically stable that the surface will not be oxidized during a series of multi-layer wiring processes. Nickel or cobalt is preferably used as the second conductive material.

Further, in the multi-layer wiring board of the present invention, the wire can have a multi-layered structure comprising at least one more layer as a third layer in addition to the double layered structure consisting of the first and the second layers. In this case, as a third conductive material which forms the third layer, it is preferable to use a conductive material which has a relative magnetic permeability larger than that of the first conductive material which forms the first layer. It is also preferable that the relative magnetic permeability of the third conductive material is different from the relative magnetic permeability of the second conductive material. Same as in the second conductive material, nickel (Ni), cobalt (Co), or an alloy comprising nickel and/or cobalt are preferably selected as the third conductive material. When the wire in the multi-layer wiring board of the present invention has a multi-layered structure consisting of more than two layers, the characteristic impedance of the wire can be adjusted more precisely by selecting the thickness and the conductive material of the third layer in addition to those of the second layer, which is advantageous effect.

In the multi-layer wiring board of the present invention, polyimide is preferably used as a material which forms insulating layers in view of its dielectric constant and the easiness in being formed into insulating layers.

Furthermore, the present invention resolves the disadvantages as above mentioned by providing a process for manufacturing a multi-layer wiring board, in which more than one wiring layers are stacked on a substrate with an insulating layer between them, comprising the following steps in a process for forming a wire in the wiring layer;

a step of forming a first layer using a first conductive material, and a step of forming a second layer, which stacks together with the first layer, using a second conductive material having a relative magnetic permeability larger than that of the first conductive material, thereby adjusting the characteristic impedance of the wire to a value closer to 50 ohm than the characteristic impedance of a wire having the thickness of the sum of the thicknesses of the first and the second layers, and is made of said first conductive material only.

In addition, the present invention resolves the disadvantages as above mentioned by providing a process for manufacturing a multi-layer wiring board, in which more than one wiring layers are stacked on a substrate with an insulating layer between them, comprising the following steps in a process for forming a wire in the wiring layer;

a step of forming a first layer using a first conductive material, and a step of forming a second layer and at least one third layer, which stack together with the first layer, using a second conductive material and a third conductive material, respectively, both having a relative magnetic permeability larger than that of the first conductive material, thereby adjusting the characteristic impedance of the wire to a value closer to 50 ohm than the characteristic impedance of a wire having the thickness of the sum of the thicknesses of the first, the second and the third layers, and is made of said first conductive material only.

In addition, the present invention also resolves the disadvantages as above mentioned by providing a probe card equipped with a multi-layer wiring board of the present invention.

Advantageous Effects of the Present Invention

According to the multi-later wiring board and the process for manufacturing the same of the present invention, a wire formed in a wiring layer of a multi-layer wiring board is made to have a layered structure consisting of a first layer made of a first conductive material and a second layer made of a second conductive material having a relative magnetic permeability larger than that of the first conductive material, or to have a layered structure consisting of more than two layers in which at least one layer made of a third conductive material having a relative magnetic permeability larger than that of the first conductive material stacks in addition to said two layered structure as a third layer, and thereby it is possible to adjust the characteristic impedance of the wire to a value close to desired 50 ohm. According to the present invention, therefore, it becomes relatively easy to achieve impedance matching between the terminals and the signal lines connected to them even when a wiring interval is narrowed in accordance with narrow-pitch of the terminals, and thereby signal transmission with less distortion and less transmission loss is attained, which is an advantageous effect. According to the probe card equipped with a multi-layer wiring board of the present invention, it is possible to inspect electrical properties of a semiconductor device, such as LSI, etc. with high accuracy, even when the semiconductor device has a narrow terminal pitch or a narrow electrode pitch, which is an advantageous effect.

DESCRIPTION OF THE PREFERRED EMBODIMENTS

Hereinafter, the present invention is explained in detail with reference to the accompanying drawings. As a matter of course, the present invention is not limited to the illustrated examples.

Figure 1:
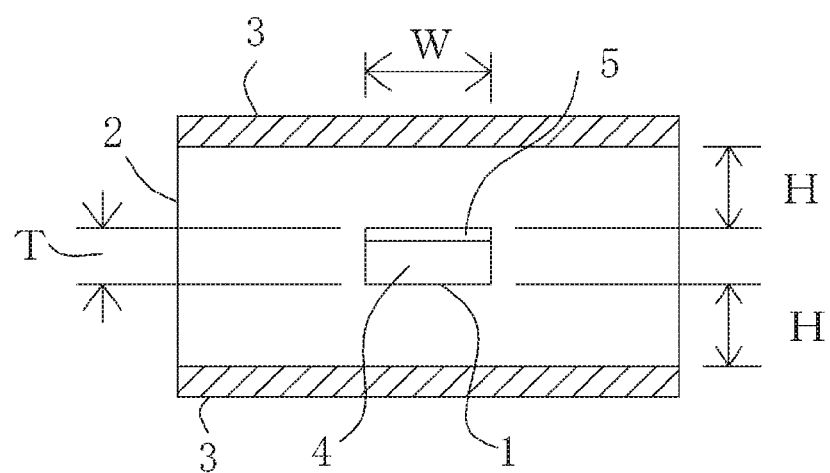
FIG. 1 is a schematic drawing showing a part of a multi-layer wiring board of the present invention.

FIG. 1 is a schematic drawing which shows a part of a multi-layer wiring board of the present invention. In FIG. 1, the reference numeral 1 indicates a wire, 2 indicates an insulating layer, and 3 indicates a solid pattern ground layer. In this example, the insulating layers 2 and the solid pattern ground layers 3 exist in both upper and lower sides of the wire 1, and they form a strip line which composes a multi-layer wiring board. The reference symbol W indicates the width of the wire 1, T indicates the thickness of the wire 1, and H indicates the thickness of each of the insulating layers 2 existing upper and lower side of the wire 1. As shown in FIG. 1, the insulating layer 2 existing in upper side of the wire 1 is same as the insulating layer 2 existing in lower side of the wire 1 in their thickness H. The reference numeral 4 indicates a first layer and 5 indicates a second layer.

Figure 2:
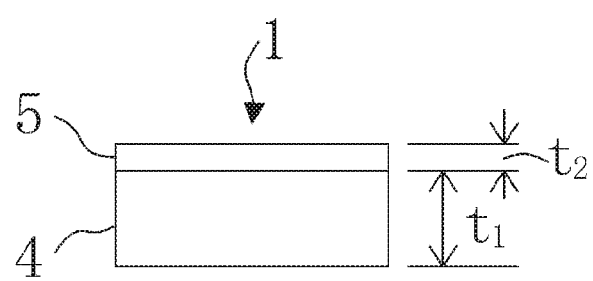
FIG. 2 is a drawing showing a part of the wire only.

FIG. 2 is a drawing which shows the wire 1 in FIG. 1 only. As shown in FIG. 2, the wire 1 has a double layered structure consisting of the first layer 4 made of a first conductive material and the second layer 5 stacked thereon and made of a second conductive material. As the first conductive material which forms the first layer 4, conventional conductive materials used for wiring, such as copper (Cu) and silver (Ag), for example, are used. Copper is preferably used in view of the cost.

On the other hand, as the second conductive material which forms the second layer 5, any appropriate materials can be used so long as they have a relative magnetic permeability larger than that of the first conductive material. Nickel or cobalt, however, is preferably used because they are easily available, hard to be oxidized, and have a relatively large relative magnetic permeability. An alloy comprising nickel, cobalt, or nickel and cobalt is preferable used as the second conductive material.

The reference symbol $t_1$ represents the thickness of the first layer, and $t_2$ represents the thickness of the second layer. Basically, there are no limitations with respect to the thickness $t_1$ of the first layer and the thickness $t_2$ of the second layer. As mentioned above, however, in order to be adapted to the terminal interval of 50 μm or less in LSI and the like under the narrow-pitch tendency, the wire 1 is required to have the width W of 25 μm or less, and in order to make flow electric current of about 1 A in the wire 1 having such width W, the first layer made of the first conductive material is required to have the thickness $t_1$ of at least 6 μm, even when copper (Cu) or silver (Ag), which has low electric resistivity, is used as the first conductive material. On the other hand, when the thickness $t_1$ of the first layer becomes too large to be more than 20 μm, the total thickness of the wire 1 including the thickness of the second layer much exceeds 20 μm and the difference in thickness becomes large between the area with the wire and the area without the wire, which invites difficulty in the applying process of insulating material to form an insulating layer and affects adhering properties of the insulating layer. In consequence, defects such as holes may be created in the insulating layer, which may prevent the insulating layer from maintaining required insulation. It is preferable, therefore, that the first layer has the thickness $t_1$ of not less than 6 μm, but not more than 20 μm.

The thickness $t_2$ of the second layer is set to a value which is able to make the characteristic impedance of the wire 1 close to 50 ohm when the second layer is stacked on the first layer, and therefore there are basically no special limitations with respect to the thickness $t_2$ of the second layer. However, it is preferable that the thickness $t_2$ of the second layer is not less than 5% of the thickness $t_1$ of the first layer, but not more than 50% of the thickness $t_1$ of the first layer. When the thickness $t_2$ is less than 5% of the thickness $t_1$, it becomes difficult by stacking the second layer to adjust the characteristic impedance of the wire to a value closer to 50 ohm than that of a wire having the same thickness as the wire of the double layered structure but being made of the first conductive material only, which is not preferable. On the contrary, when the thickness $t_2$ is more than 50% of the thickness $t_1$, the ratio of the first conductive material which forms the first layer becomes relatively small and the conductor resistance increases. In consequence, the desired electric current capacity is unsatisfied, which is not preferable.

Although the second layer is stacked on the first layer in FIG. 2, the first layer can be stacked on the second layer. As mentioned above, however, it is preferable to stack the second layer on the first layer in view of prevention of surface oxidation of the first conductive material during the manufacturing processes.

When copper is used as the first conductive material which forms the first layer, nickel is used as the second conductive material which forms the second layer, the total thickness T of the wire 1 is 10 μm, the thickness $t_1$ of the first layer 4 is 8 μm, the thickness $t_2$ of the second layer 5 is 2 μm (the thickness $t_2$ corresponds to 25% of the thickness $t_1$), the width W of the wire 1 is 25 μm, wiring interval is 25 μm, the thickness H of the insulating layer 2 is 20 μm, and polyimide having dielectric constant $\in_r$ of 3.7 is used as an insulating material which forms the insulating layer 2, then the characteristic impedance of the wire 1 is calculated as follows.

In the wire 1 as shown in FIG. 1, the wire 1 having the total thickness T of 10 μm consists of the first layer having the thickness of 8 μm and the second layer having the thickness of 2 μm. When considering the first layer having the thickness of 8 μm to be formed by stacking four layers having the thickness of 2 μm, the combined impedance $Z_2$ of the wire 1 is calculated by the following Formula (5).

$$\frac{5}{Z_2} = \frac{4}{Z_0} + \frac{1}{Z_1} \qquad \text{Formula (5)}$$

In Formula (5), $Z_0$ represents the characteristic impedance of the first layer and $Z_1$ represents the characteristic impedance of the second layer.

Figure 6:
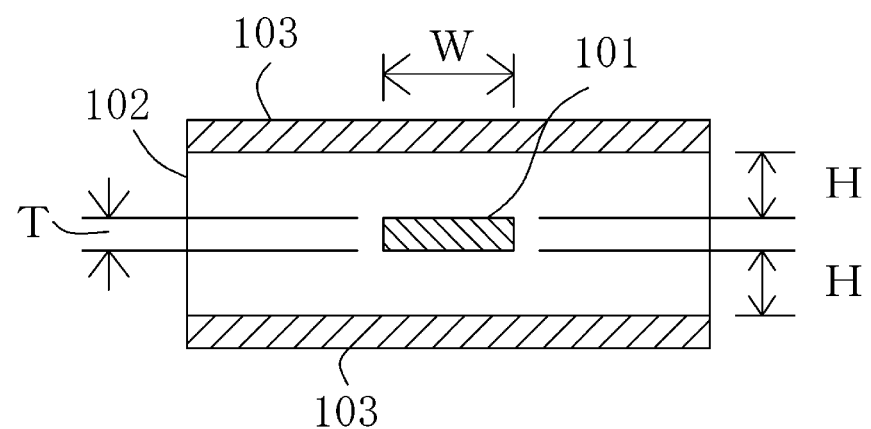
FIG. 6 is a schematic drawing showing a strip line.

Since the wire 1 as shown in FIG. 1 is same as the strip line as shown in FIG. 6 except that a part of the wire 1 is replaced by the second layer made of nickel, the characteristic impedance $Z_0$ is $Z_0=36.0$ (Ω) as calculated above. On the other hand, since the relative magnetic permeability of nickel is 600, the characteristic impedance $Z_1$ of the second layer is calculated as follows based on Formula (4) above mentioned.

$$Z_1 = \sqrt{600} \times 36.0 = 882 \qquad \text{Formula (6)}$$

When $Z_0=36.0$ (Ω) and $Z_1=882$ (Ω) are substituted into Formula (5), the combined characteristic impedance $Z_2$ of the wire 1 is calculated as $Z_2=44.6$ (Ω), which is closer to the desired 50 ohm than the characteristic impedance obtained when all of the wire 1 is made of the first conductive material, in other words, when a wire having the same thickness T as the wire 1 of the double layered structure is made of the first conductive material only. As described above, according to the multi-layer wiring board of the present invention, by stacking the first layer made of the first conductive material and the second layer made of the second conductive material having a relative magnetic permeability larger than that of the first conductive material to form the wire 1 having a double layered structure, the characteristic impedance of the wire 1 is adjusted to a value closer to 50 ohm than the characteristic impedance obtained when a wire having the same thickness as the wire 1 of the double layered structure is made of the first conductive material only.

In the example mentioned above, the thickness $t_1$ of the first layer 4 is set to 8 μm and the thickness $t_2$ of the second layer 5 is set to 2 μm, and therefore the thickness $t_2$ of the second layer 5 corresponds to 25% (=(2 μm/8 μm)×100) of the thickness $t_1$ of the first layer 4. Needless to say, when the ratio of the thickness $t_2$ of the second layer to the thickness $t_1$ of the first layer is made larger than 25%, the characteristic impedance of the wire 1 becomes closer to 50 ohm.

Further, while copper is used as the first conductive material which forms the first layer and nickel is used as the second conductive material which forms the second layer in the above embodiment, silver, for example, can be used in place of copper as the first conductive material and cobalt or alloy comprising nickel and/or cobalt, for example, can be used in place of nickel as the second conductive material. In those cases too, the ratio of the thickness $t_2$ of the second layer to the thickness $t_1$ of the first layer can be set taking the relative magnetic permeability of each materials into consideration so that the characteristic impedance of the wire 1 will be close to 50 ohm.

Figure 3:
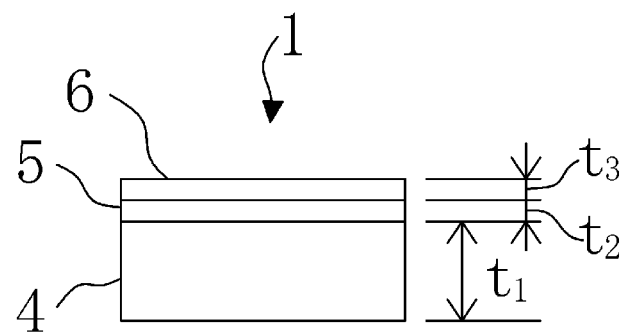
FIG. 3 is a drawing showing another example of a wire in a multi-layer wiring board of the present invention.

FIG. 3 is a drawing which shows another example of the wire 1 of the multi-layer wiring board of the present invention. In this example, the wire 1 has a three layered structure in which the third layer 6 is further stacked on the second layer 5. A conductive material having a relative magnetic permeability larger than that of the first conductive material which forms the first layer 4 can be used as the third conductive material which forms the third layer 6. Same as in the second conductive material, nickel, cobalt, or an alloy comprising nickel and/or cobalt is preferably used as the third conductive material. It is preferable, however, that the relative magnetic permeability of the third conductive material is different from that of the second conductive material. When nickel, for example, is selected as the second conductive material which forms the second layer 5, the third conductive material which forms the third layer 6 is preferably selected from conductive materials other than nickel, in other words, from cobalt, an alloy comprising cobalt, an alloy comprising nickel or an alloy comprising nickel and cobalt, for example.

The reference symbol $t_3$ represents the thickness of the third layer 6. In the case that the wire 1 has the three layered structure as shown in FIG. 3, the sum of the thickness $t_2$ of the second layer 5 and the thickness $t_3$ of the third layer 6 ($t_2+t_3$) is preferably not less than 5% but not more than 50% of the thickness $t_1$ of the first layer, same as in the case where the wire 1 has the double layered structure. The thickness $t_2$ of the second layer 5 and the thickness $t_3$ of the third layer 6 can be either same or different each other. In addition, while only one layer exists as the third layer 6 in this embodiment, more than one third layers 6 can exist. In that case, the sum of the thicknesses of all the third layers 6 and the thickness of the second layer 5 is of course preferably not less than 5% but not more than 50% of the thickness $t_1$ of the first layer. Furthermore, while the third layer 6 is stacked on the second layer 5 in the illustrated example, the stacking order of the first layer 4, the second layer 5 and the third layer 6 is not limited to the illustrated one.

Figure 4:
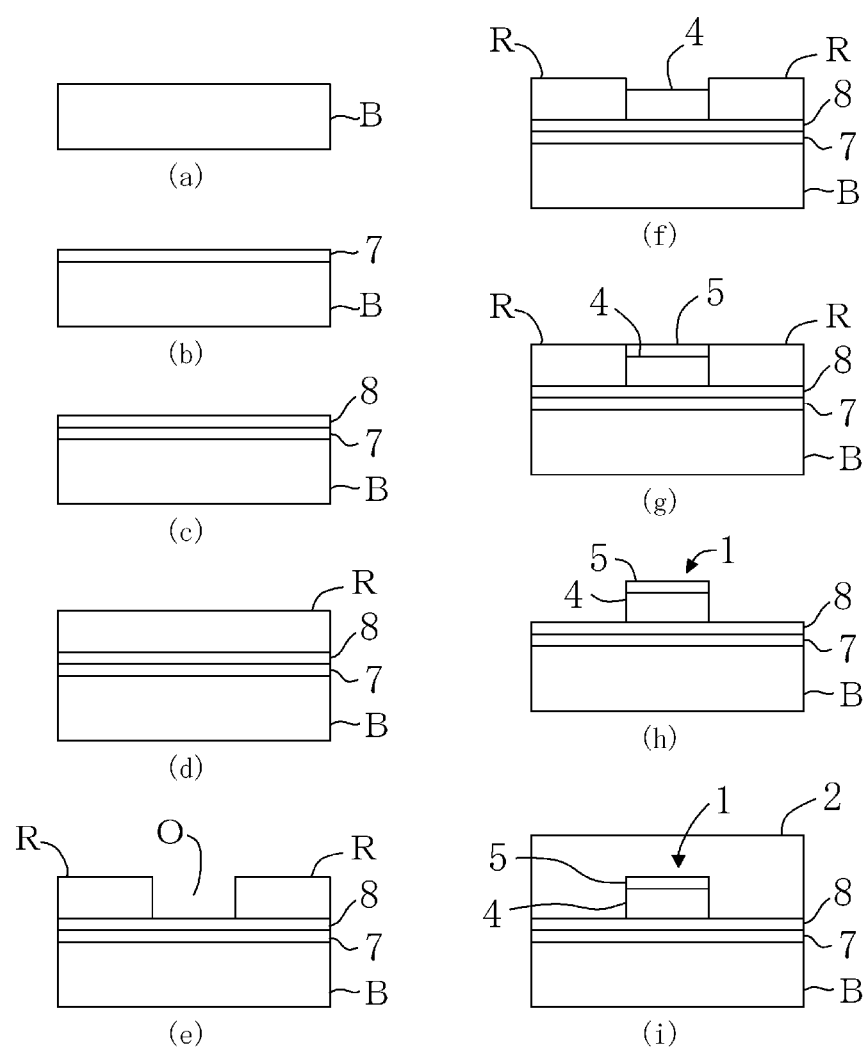
FIG. 4 is a drawing showing an example of a process for manufacturing a multi-layer wiring board of the present invention.
Figure 5:
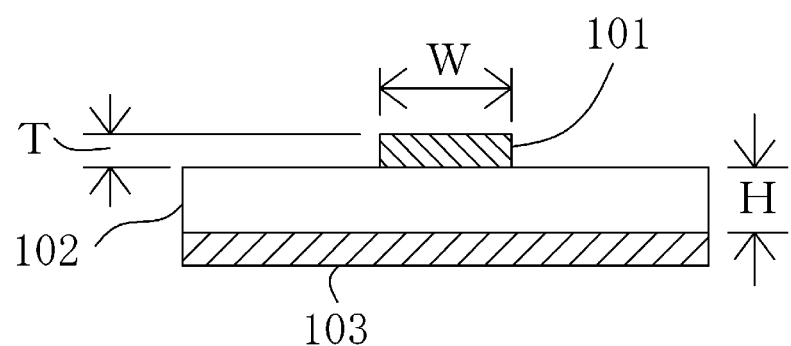
FIG. 5 is a schematic drawing showing a microstrip line.

FIG. 4 is a drawing which shows an example of manufacturing process of the multi-layer wiring board of the present invention. First, as shown in FIG. 4(a), a substrate B is prepared. As the substrate B, any suitable one selected from the conventional ceramic substrates or glass substrates used in the field of the art in general can be used. Then, as shown in FIG. 4(b), a thin film of titanium or chromium with the thickness ranging from 10 nm to 500 nm is formed on almost all the surface of substrate B by using appropriate means such as sputtering, vacuum evaporation and the like, to form an adhesive layer 7.

After that, as shown in FIG. 4(c), another thin film consisting of a metallic element of platinum group, such as nickel, palladium, or platinum, etc. with the thickness ranging from 10 nm to 1000 nm is formed on the surface of the adhesive layer 7 by using in the same manner appropriate means such as sputtering, vacuum evaporation and the like, to form intermediary layer 8. After the intermediary layer 8 is formed, photoresist R having the thickness exceeding the thickness of the plating layer formed by the successive electroplating is coated on all over the surface of the substrate B as shown in FIG. 4(d), and then an opening O having the shape corresponding to a wiring pattern is formed by photolithography as shown in FIG. 4(e).

Next, a plating layer of the first conductive material with the thickness ranging from 6 µm to 20 µm is formed in the opening O, as shown in FIG. 4(f), by an electroplating method utilizing the intermediary layer 8 and the adhesive layer 7 exposed in the opening O as one of the electrodes, thereby the first layer 4 is formed. This step corresponds to a step of forming a first layer using a first conductive material in the manufacturing process of the present invention.

After that, a plating layer of the second conductive material with the thickness ranging from 5% to 50% of the thickness of the first layer 4 is formed on the first layer 4 using electroplating method in the same manner, as shown in FIG. 4(g), to form the second layer 5. This step corresponds to a step of forming a second layer, which stacks together with the first layer, using a second conductive material having a relative magnetic permeability larger than that of the first conductive material, thereby adjusting the characteristic impedance of the wire to a value closer to 50 ohm than the characteristic impedance of a wire having the thickness of the sum of the thicknesses of the first layer and the second layer, and is made of said first conductive material only in the manufacturing process of the present invention.

Further, the third layer 6 can be formed by adding on the second layer 5 a plating layer of the third conductive material so that the total thickness of the second layer 5 and the third layer 6 will be in the range of 5% to 50% of the thickness of the first layer 4. When the third layer 6 is formed, the above step, including the step of forming the second layer 5, corresponds to a step of forming a second layer and at least one third layer, which stack together with the first layer, using a second conductive material and a third conductive material, respectively, both having a relative magnetic permeability larger than that of the first conductive material, thereby adjusting the characteristic impedance of the wire to a value closer to 50 ohm than the characteristic impedance of a wire having the thickness of the sum of the thicknesses of the first layer, the second layer and the third layer, and is made of said first conductive material only in the manufacturing process of the present invention.

After the formation of the first layer 4 and the second layer 5, the photoresist R remaining on the intermediary layer 8 is taken off by using solvent or the like, and then the exposed parts of the intermediary layer 8 and the adhesive layer 7 are removed by etching one by one using physical etching system such as ion beam etching so as to make the wire 1 an electrically independent wiring pattern as shown in FIG. 4(h).

Further, by advancing polymerization reaction to the middle of the reaction beforehand, a photosensitive polyimide sheet having the thickness ranging from 10 µm to 50 µm is prepared. The photosensitive polyimide sheet is affixed, under the pressure ranging from 0.1 MPa to 1 MPa, on the substrate B on which the wire 1 is formed, while the substrate B on which the wire 1 is formed as an electrically independent wiring patter is heated at the temperature ranging from 60° C. to 150° C. Then, by pattern exposure using a photomask or exposure using a direct writing system, all over the surface of said photosensitive polyimide sheet is exposed except for an area for via hole. After that, a hole is made in unexposed area by solvent shower to form an opening for a via hole in the polyimide sheet. Then, the substrate on which the polyimide sheet is affixed is heated at the temperature ranging from 200° C. to 400° C. to complete polymerization reaction of the polyimide sheet and thereby the insulating layer 2 is formed over the wire 1 as shown in FIG. 4(i).

The multi-layer wiring board of the present invention is manufactured by repeating the step of forming the adhesive layer 7 and the steps thereafter. In the multi-layer wiring board of the present invention thus manufactured, the characteristic impedance of the wire is adjusted to a value closer to 50 ohm than the characteristic impedance of a wire having the thickness of the sum of the thickness $t_1$ of the first layer 4 and the thickness $t_2$ of the second layer 5 and is made of the first conductive material only.

Thus manufactured multi-layer wiring board of the present invention can be used in the same manner as conventional multi-layer wiring boards by putting it in a probe card which is used for inspecting electrical properties of a semiconductor device such as LSI and the like. A probe card equipped with the multi-layer wiring board of the present invention is able to transmit electrical signals with less distortion and less deterioration of the waveform, and with less transmission loss because the characteristic impedances of the wires in the multi-layer wiring board are adjusted to 50 ohm or a value close to 50 ohm, and thereby makes it possible to inspect electrical properties of a semiconductor device, such as LSI and the like, with higher accuracy even when the terminal pitch or the electrode pitch in the semiconductor device is narrow.

INDUSTRIAL APPLICABILITY

As explained above, according to the multi-layer wiring board and the process for manufacturing the same of the present invention, it is possible to adjust the characteristic impedance of a wire in the multi-layer wiring board to a value close the desired 50 ohm, and therefore it becomes relatively easy to achieve impedance matching between the terminals and the signal lines connected to them even when the wiring interval is made narrow in order to adapting the narrow-pitch tendency of the terminal interval, thereby signal transmission with less distortion and less loss is realized. According to a probe card equipped with a multi-layer wiring board of the present invention, it is possible to inspect electrical properties of a semiconductor device, such as LSI, etc., with high accuracy, even when the terminal pitch or electrode pitch in the semiconductor device is narrow, which is an advantageous effect. The present invention possesses a great industrial applicability.

EXPLANATION OF SYMBOLS 1, 101 wire
2, 102 insulating layer
3, 103 solid pattern ground layer
4 first layer
5 second layer
6 third layer
7 adhesive layer
8 intermediary layer
R photo resist
O opening

What is claimed is:

1. A multi-layer wiring board, in which more than one wiring layers are stacked on a substrate with an insulating layer between them,
wherein a wire formed in the wiring layer consists of a first layer and a second layer to form a double layered structure, and said first layer is made of a first conductive material and said second layer is made of a second conductive material having relative magnetic permeability of 10 or more and larger than that of the first conductive material,
thereby the characteristic impedance of said wire is adjusted to a value closer to 50 ohm than that of a wire which has the same thickness as of said wire having the double layered structure, and is made of said first conductive material only.

2. A multi-layer wiring board of claim 1, wherein the first conductive material is copper or silver, and the second conductive material is nickel, cobalt, or an alloy comprising nickel and/or cobalt.

3. A multi-layer wiring board of claim 1, wherein the width of the wire is not less than 10 μm, but not more than 25 μm, the thickness of the first layer is not less than 6 μm, but not more than 20 μm, and the thickness of the second layer is not less than 5%, but not more than 50% of the thickness of the first layer.

4. A multi-layer wiring board of claim 1 wherein the second layer is placed at a position further from the substrate than the first layer.

5. A multi-layer wiring board of claim 1, wherein the material which forms the insulating layer is polyimide.

6. A multi-layer wiring board of claim 1, wherein the wire has at least one layer made of a third conductive material having a relative magnetic permeability of 10 or more and larger than that of the first conductive material as a third layer in addition to the first layer and the second layer to form a multi-layered structure, thereby the characteristic impedance of the wire is adjusted to a value closer to 50 ohm than that of a wire having the same thickness as the wire of the multi-layered structure and is made of the first conductive material only.

7. A multi-layer wiring board of claim 6, wherein the third conductive material is nickel, cobalt, or an alloy comprising nickel and/or cobalt.

8. A process for manufacturing a multi-layer wiring board of claim 1, in which more than one wiring layers are stacked on a substrate with an insulating layer between them, comprising the following steps in a process for forming a wire in the wiring layer;
a step of forming a first layer using a first conductive material, and
a step of forming a second layer, which stacks together with the first layer, using a second conductive material having a relative magnetic permeability of 10 or more and larger than that of the first conductive material, thereby adjusting the characteristic impedance of the wire to a value closer to 50 ohm than the characteristic impedance of a wire having the thickness of the sum of the thicknesses of the first and the second layers, and is made of said first conductive material only.

9. A process for manufacturing a multi-layer wiring board of claim 6, in which more than one wiring layers are stacked on a substrate with an insulating layer between them, comprising the following steps in a process for forming a wire in the wiring layer;
a step of forming a first layer using a first conductive material, and
a step of forming a second layer and at least one third layer, which stack together with the first layer, using a second conductive material and a third conductive material, respectively, both having a relative magnetic permeability of 10 or more and larger than that of the first conductive material, thereby adjusting the characteristic impedance of the wire to a value closer to 50 ohm than the characteristic impedance of a wire having the thickness of the sum of the thicknesses of the first, the second and the third layers, and is made of said first conductive material only.

10. A probe card, which equips with a multi-layer wiring board of claim 1.

11. A multi-layer wiring board of claim 3, wherein the wire has at least one layer made of a third conductive material having a relative magnetic permeability of 10 or more and larger than that of the first conductive material as a third layer in addition to the first layer and the second layer to form a multi-layered structure, thereby the characteristic impedance of the wire is adjusted to a value closer to 50 ohm than that of a wire having the same thickness as the wire of the multi-layered structure and is made of the first conductive material only.

12. A multi-layer wiring board of claim 11, wherein the third conductive material is nickel, cobalt, or an alloy comprising nickel and/or cobalt.

13. A multi-layer wiring board of claim 5, wherein the wire has at least one layer made of a third conductive material having a relative magnetic permeability of 10 or more and larger than that of the first conductive material as a third layer in addition to the first layer and the second layer to form a multi-layered structure, thereby the characteristic impedance of the wire is adjusted to a value closer to 50 ohm than that of a wire having the same thickness as the wire of the multi-layered structure and is made of the first conductive material only.

14. A multi-layer wiring board of claim 13, wherein the third conductive material is nickel, cobalt, or an alloy comprising nickel and/or cobalt.

15. A process for manufacturing a multi-layer wiring board of claim 3, in which more than one wiring layers are stacked on a substrate with an insulating layer between them, comprising the following steps in a process for forming a wire in the wiring layer;

a step of forming a first layer using a first conductive material, and a step of forming a second layer, which stacks together with the first layer, using a second conductive material having a relative magnetic permeability of 10 or more and larger than that of the first conductive material, thereby adjusting the characteristic impedance of the wire to a value closer to 50 ohm than the characteristic impedance of a wire having the thickness of the sum of the thicknesses of the first and the second layers, and is made of said first conductive material only.

16. A process for manufacturing a multi-layer wiring board of claim 5, in which more than one wiring layers are stacked on a substrate with an insulating layer between them, comprising the following steps in a process for forming a wire in the wiring layer;

a step of forming a first layer using a first conductive material, and a step of forming a second layer, which stacks together with the first layer, using a second conductive material having a relative magnetic permeability of 10 or more and larger than that of the first conductive material, thereby adjusting the characteristic impedance of the wire to a value closer to 50 ohm than the characteristic impedance of a wire having the thickness of the sum of the thicknesses of the first and the second layers, and is made of said first conductive material only.

17. A probe card, which equips with a multi-layer wiring board of claim 2.

18. A probe card, which equips with a multi-layer wiring board of claim 3.

19. A probe card, which equips with a multi-layer wiring board of claim 5.

20. A probe card, which equips with a multi-layer wiring board of claim 6.

21. A probe card, which equips with a multi-layer wiring board of claim 7.

* * * * *